(12) United States Patent
Li et al.

(10) Patent No.: US 12,200,895 B2
(45) Date of Patent: Jan. 14, 2025

(54) GPU TRAY AND CHASSIS WITH THE SAME

(71) Applicant: Fulian Precision Electronics (Tianjin) Co., LTD., Tianjin (CN)

(72) Inventors: Zhen-Lei Li, Tianjin (CN); Wen-Hu Lu, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 137 days.

(21) Appl. No.: 18/123,173

(22) Filed: Mar. 17, 2023

(65) Prior Publication Data

US 2024/0114642 A1 Apr. 4, 2024

(30) Foreign Application Priority Data

Sep. 30, 2022 (CN) .......................... 202222614611.8

(51) Int. Cl.
*H05K 7/14* (2006.01)
*H05K 5/02* (2006.01)

(52) U.S. Cl.
CPC ......... *H05K 7/1489* (2013.01); *H05K 5/0291* (2013.01)

(58) Field of Classification Search
None
See application file for complete search history.

(56) References Cited

U.S. PATENT DOCUMENTS

| | | | | |
|---|---|---|---|---|
| 11,369,033 | B1* | 6/2022 | Tsorng | H05K 7/1487 |
| 2008/0106862 | A1* | 5/2008 | Liang | H05K 1/14 |
| | | | | 361/679.41 |
| 2011/0249397 | A1* | 10/2011 | Liu | G06F 1/185 |
| | | | | 361/784 |
| 2014/0334122 | A1* | 11/2014 | Tian | H05K 7/1487 |
| | | | | 361/801 |
| 2021/0410315 | A1* | 12/2021 | Pham | H05K 7/1489 |
| 2022/0057848 | A1* | 2/2022 | Chang | H05K 5/0265 |

\* cited by examiner

*Primary Examiner* — James Wu
*Assistant Examiner* — Christopher L Augustin
(74) *Attorney, Agent, or Firm* — ScienBiziP, P.C.

(57) ABSTRACT

A graphics processing unit (GPU) tray includes a base, a first riser, and a second riser. The base is provided with a first bracket and a second bracket spaced from each other, the first riser is connected to one side of the first bracket and the second bracket, and the second riser is connected to the other side of the first bracket and a second bracket. The first riser is provided with a first connector socket facing the second riser, and the second riser is provided with a second connector socket facing the first riser. A first GPU is plugged to the first connector socket and a second GPU is plugged to the second connector socket. The GPU tray compress the installation space of the GPUs and allows four GPUs can be installed in the chassis. A chassis accommodating the GPU tray is also disclosed.

10 Claims, 9 Drawing Sheets

GPU TRAY AND CHASSIS WITH THE SAME

CROSS-REFERENCE TO RELATED APPLICATION

This application claims priority to China Application No. 202222614611.8, having a filing date of Sep. 30, 2022, filed in China State Intellectual Property Administration, the entire contents of which are hereby incorporate by reference.

FIELD

The subject matter relates to the computer technical field, and more particularly to a GPU tray and a chassis with the GPU tray.

BACKGROUND

A rack unit (abbreviated U or RU) is a unit of measure defined as 1¾ inches in height (44.45 mm). Generally, a 2U chassis has a height of 3.5 inches and a width of standard dimension, and there are three graphics processing units (GPU) can be set side-by-side along the width of the 2U chassis, and only one graphics processing unit can be placed along the thickness of the chassis. To make full use of the space of the chassis, how to place four graphics processing units in the width of the chassis while ensuring the stability of the graphics processing unit installation is a problem that technical in the art need to solve urgently.

SUMMARY

An objective of the present disclosure is achieved by providing a graphics processing unit (GPU) tray, the GPU tray includes a base, a first riser, and a second riser, the base is provided with a first bracket and a second bracket, the first bracket and the second bracket are spaced from each other; the first riser is connected to one side of the first bracket and the second bracket, and two ends of the first riser are respectively connected to the first bracket and the second bracket; the second riser is connected to the other side of the first bracket and the second bracket, and two ends of the second riser are respectively connected to the first bracket and the second bracket, then the first riser is arranged opposite to the second riser relative to the first bracket and the second bracket; the first riser is provided with a first connector socket facing the second riser, and the second riser is provided with a second connector socket facing the first riser, the first connector socket is located near a side of the first riser away from the base, and the second connector socket is located near a side of the second riser, the first riser is provided with a first notch communicating with the second connector socket, and the second riser is provided with a second notch communicating with the first connector socket, a projection of the first connector socket in a direction perpendicular to the base overlaps that of the second connector socket; the first connector socket is configured for plugging a first GPU, and the second connector socket is configured for plugging a second GPU.

According to a further aspect of the application, a chassis is provided. The chassis includes a case defining a receiving groove, and two GPU trays above-mentioned received in the receiving groove, the two GPU trays are arranged side by side along a widthwise direction of the case, and the two GPU trays are arranged for supporting the first GPU and the second GPU, such that the first GPU and the second GPU are installed in the case.

BRIEF DESCRIPTION OF THE DRAWINGS

Implementations of the present technology will now be described, by way of example only, with reference to the attached figures.

DETAILED DESCRIPTION

Figure 1:
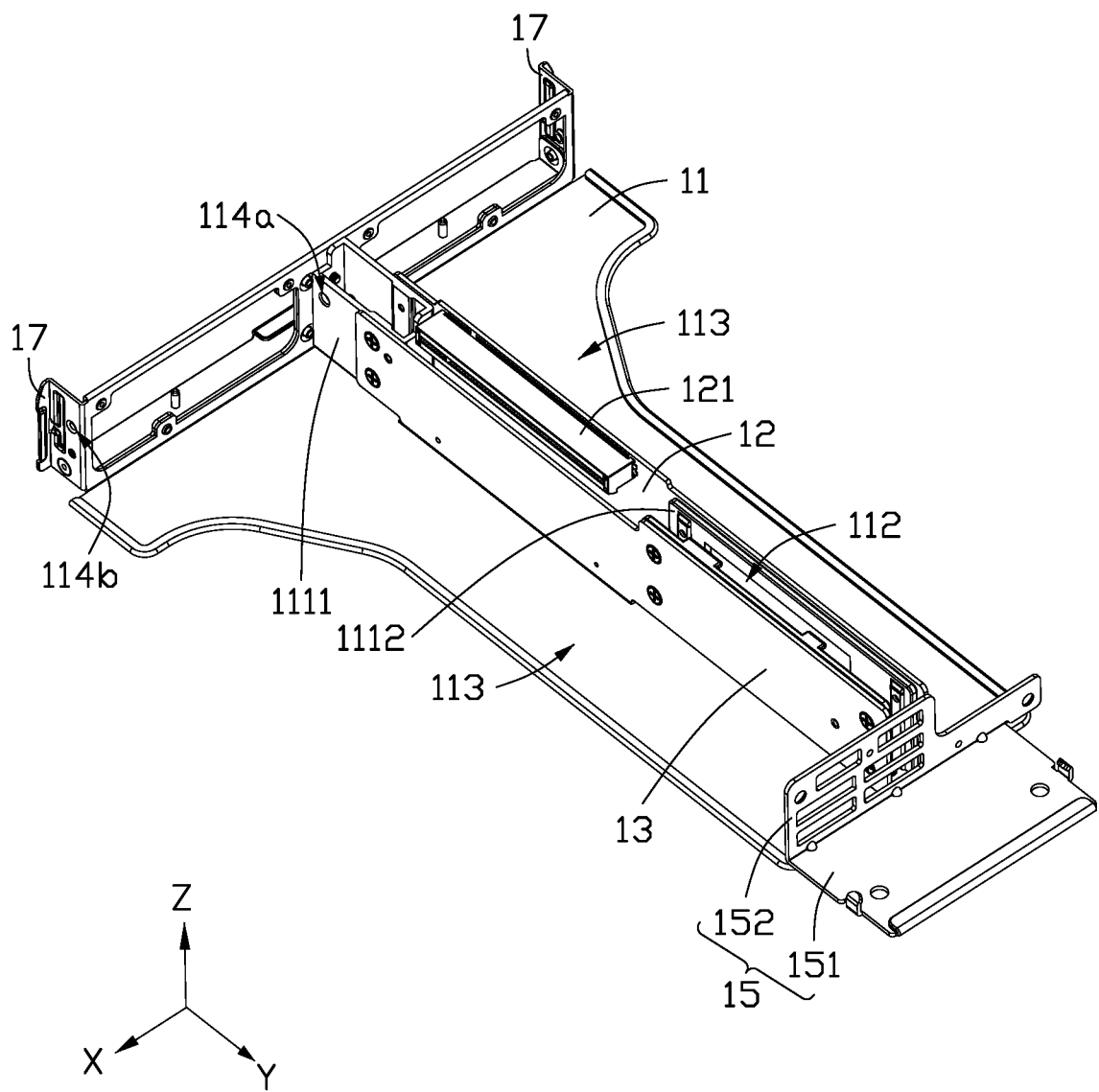
FIG. 1 is a perspective view of a GPU tray according to an embodiment of the present disclosure.

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the present disclosure.

It should be understood that, the terms "first" and "second" are used to distinguish between elements and are not used to denote a particular order or imply a number of technical features, therefore, unless specifically defined, features described as "first" and "second" may expressly or implicitly include one or more of the stated features. In the description of the present application, "plurality" means "two or more", unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

A description of the hereinafter described embodiments of the disclosure is presented herein with reference to the figures by way of exemplification and not as limitation.

Figure 2:
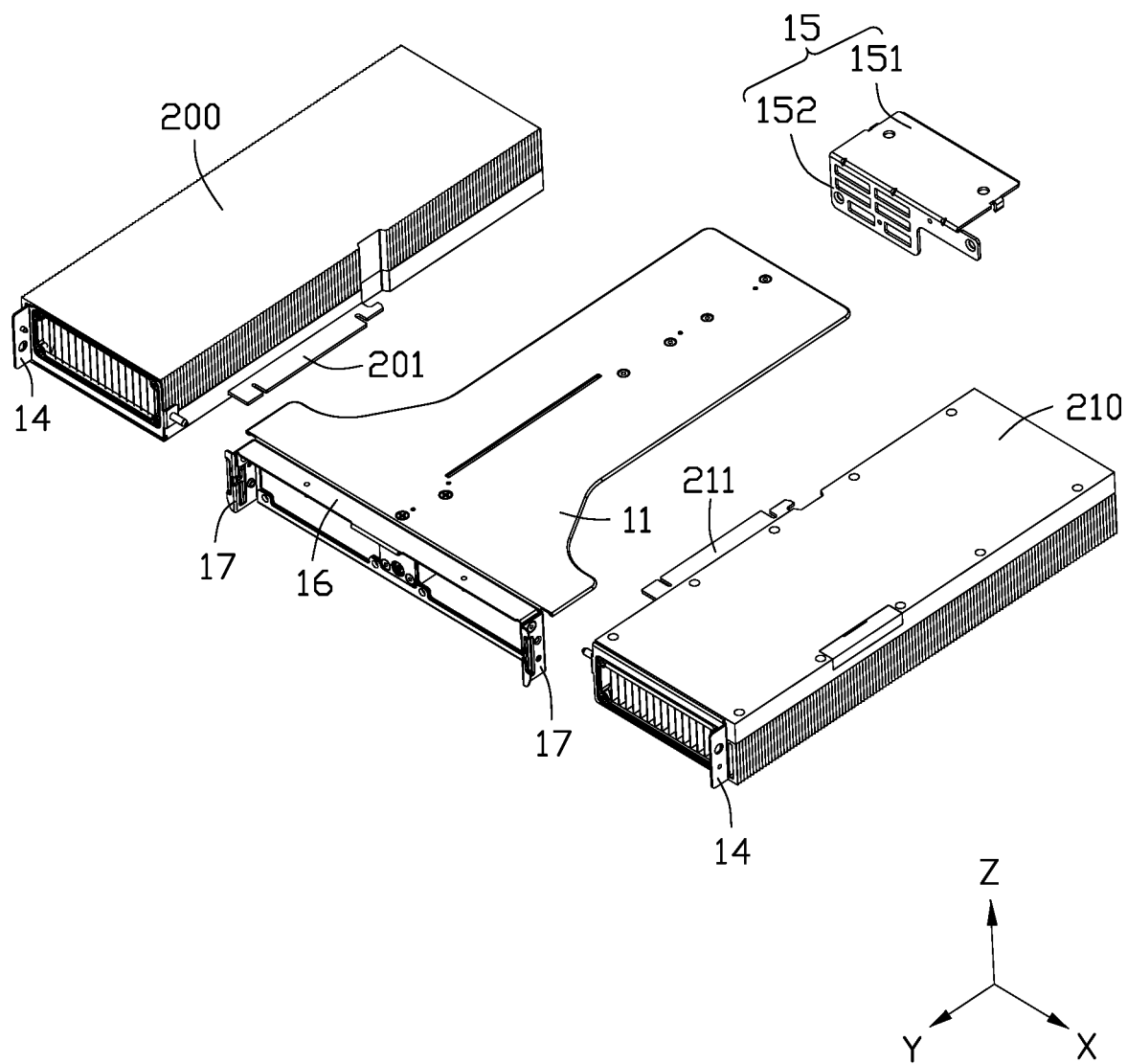
FIG. 2 shows the GPU tray in FIG. 1 and GPUs to be mounted on the GPU tray.

Referring to FIG. 1 and FIG. 2, a GPU tray 10 is provided. The GPU tray 10 is configured for installation of a first graphic processing unit (GPU) 200 and a second GPU 210, the first GPU 200 and the second GPU 210 are arranged side by side.

Referring to FIG. 1, FIG. 2, FIG. 3, FIG. 4 and FIG. 5, the GPU tray 10 includes a plate-shaped base 11, a first riser 12, and a second riser 13. The base 11 includes a first bracket 1111 and a second bracket 1112, the first bracket 1111 and the second bracket 1112 are arranged on the base 11 along a lengthwise direction of the base 11 and located at the middle of the base 11. The first bracket 1111 and the second bracket 1112 are spaced from each other, the first bracket 1111 is placed at one end of the base 11, and the second bracket 1112 is placed at the other opposite end of the base 11. The first bracket 1111 has a first mounting surface 1111a and a second mounting surface 1111b opposite to the first mounting surface 1111a, the first mounting surface 1111a and the second mounting surface 1111b are perpendicular to the base 11. The second bracket 1112 has a third mounting surface 1112a and a fourth mounting surface 1112b opposite to the third mounting surface 1112a, the third mounting surface 1112a and the fourth mounting surface 1112b are perpendicular to the base 11. The first mounting surface 1111a is located in the same plane with the third mounting surface 1112a, and the second mounting surface 1111b is located in the same plane with the fourth mounting surface 1112b. The first bracket 1111 and the second bracket 1112 divide the base 11 into two installation areas 113 along a widthwise direction of the base 11, and either side of the first bracket 1111 and the second bracket 1112 is defined as one installation area 113. The first GPU 200 and the second GPU 210 are positioned in the two installation areas 113 respectively. It should be noted that, the structure of the first bracket 1111 and the second bracket 1112 are different, in further embodiments, the structure of the first bracket 1111 and the second bracket 1112 may be the same. In this embodiment, the lengthwise direction of the base 11 is shown as Y-axis in FIG. 1, and the widthwise direction of the base 11 is shown as –axis in FIG. 1.

The first riser 12 is connected to one side of the first bracket 1111 and the second bracket 1112, and two ends of the first riser 12 are respectively connected to the first mounting surface 1111a and the third mounting surface 1112a; the second riser 13 is connected to the other side of the first bracket 1111 and the second bracket 1112, and two ends of the second riser 13 are respectively connected to the second mounting surface 1111b and the fourth mounting surface 1112b. Then the first riser 12 is arranged opposite to the second riser 13 relative to the first bracket 1111 and the second bracket 1112. The first riser 12 is provided with one or more provisions, such as a first connector socket 121 facing the second riser 13, and the second riser 13 is provided with one or more provisions, such as a second connector socket 131 facing the first riser 12. The first connector socket 121 is located near a side of the first riser 12 away from the base 11, and the second connector socket 131 is located near a side of the second riser 13. The first riser 12 is provided with a first notch 120 communicating with the second connector socket 131, and the second riser 13 is provided with a second notch 130 communicating with the first connector socket 121. A projection of the first connector socket 121 in the Z-axis direction overlaps that of the second connector socket 131. The first GPU 200 is positioned at the installation area 113 near the second riser 13, and the first GPU 200 is provided with a first connector plug 201, the first connector plug 201 extends through the second notch 130 for being plugged to the first connector socket 121, then the first GPU 200 can be installed at the first riser 120. The second GPU 210 is positioned at the installation area 113 near the first riser 12, and the second GPU 210 is provided with a second connector plug 211, the second connector plug 211 extends through the first notch 120 for being plugged to the second connector socket 131, then the second GPU 210 can be installed at the second riser 130. In this embodiment, each of the first riser 12 and the second riser 13 is arranged with circuits for providing power and data transmission for the first GPU 200 and the second GPU 210.

Figure 6:
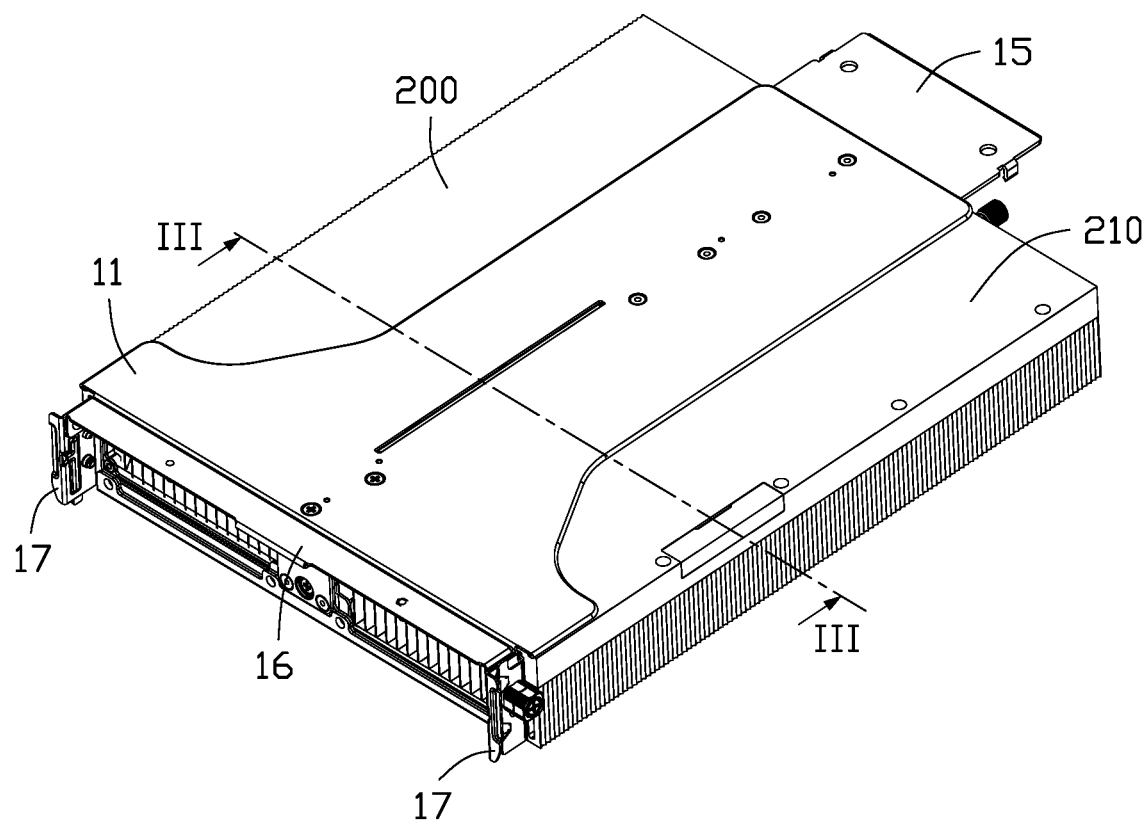
FIG. 6 is a perspective view of the GPU tray and the GPUs installed on the GPU tray according to another embodiment of the present disclosure.
Figure 7:
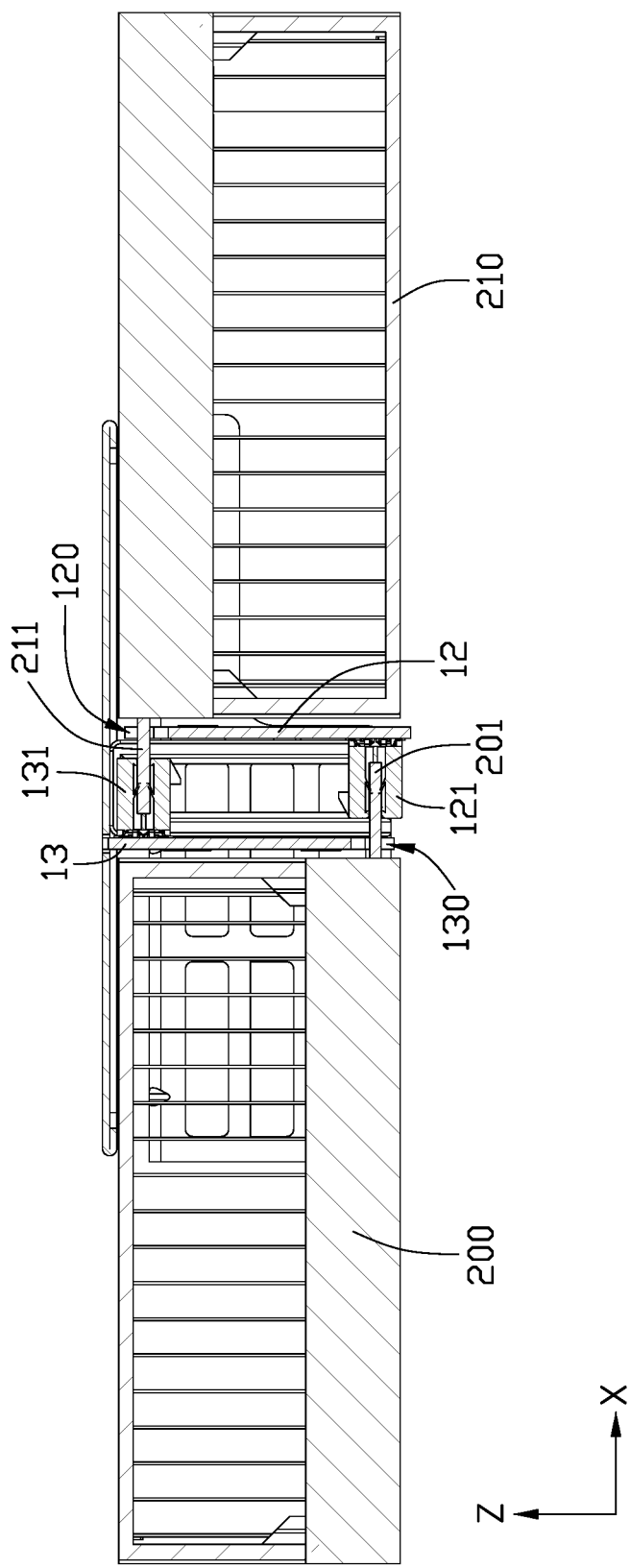
FIG. 7 is a cross section view of the GPU tray and the GPUs in FIG. 6 along III-III.

Referring to FIG. 6 and FIG. 7, the arrangement of the first connector socket 121 and the second connector socket 131 allows the first connector plug 201 of the first GPU 200 to partially overlap with the second connector plug 211 of the second GPU 210, such that the arrangement of the first GPU 200 and the second GPU 210 has a smaller width in the X-axis direction, and the GPU tray has a smaller size. The first connecter plug 201 of first GPU 200 installed on the first riser 12 partially overlaps with the second connecter plug 211 of the second GPU 210 installed on the second riser 13, then the first GPU 200 and the second GPU 210 are close to each other in the X-axis direction and occupy smaller space in the GPU tray.

Referring to FIG. 1, according to some embodiments, at least one of the first bracket 1111 and the second bracket 1112 is provided with a recess 112, the recess 112 is configured for accommodating a connecting member, the connecting member provides connections between the first riser 12, the second riser 13, and external components. In this embodiment, the recess 112 is defined in the second bracket 1112, the connecting member may be wires, the recess 112 is configured for arranging the wires, the wires are used to transmit data. In this way, by arranging the wires in the recess 112 to make full use of the width space of the base 11, and thus compressing the distance between the two GPUs and reducing the space occupied by the GPUs.

Figure 3:
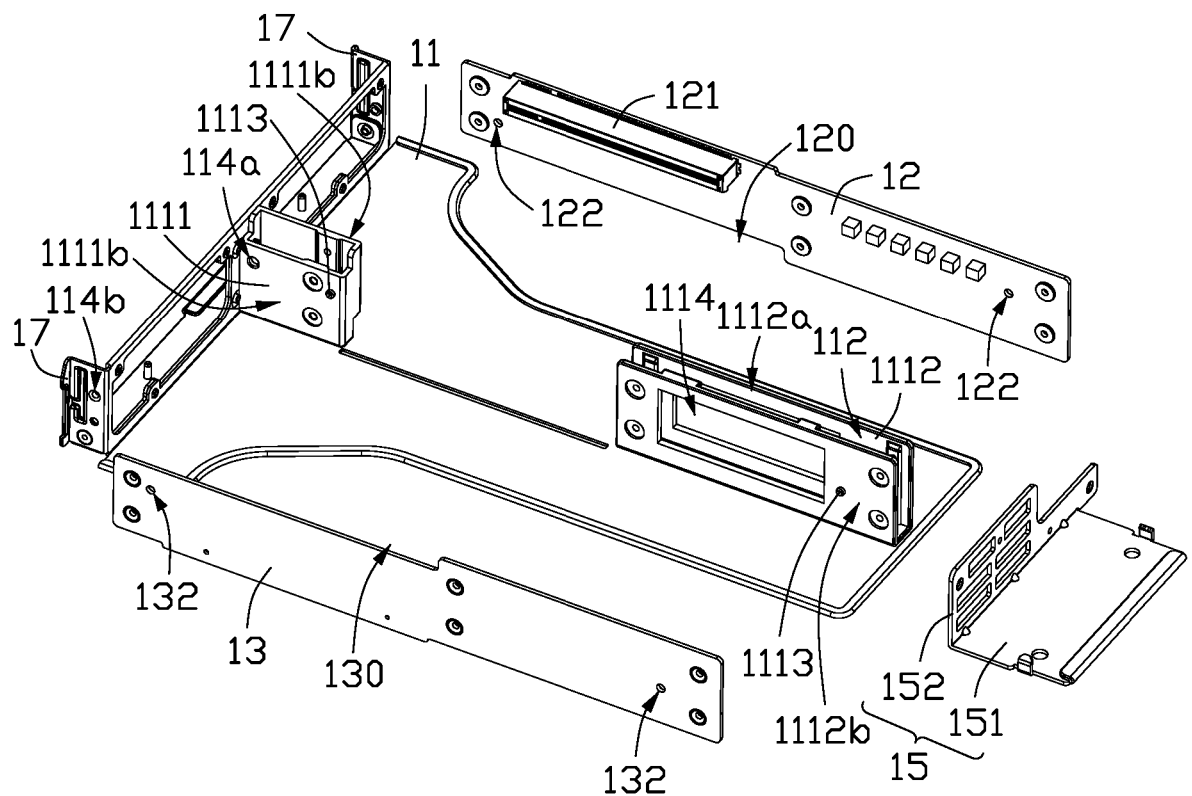
FIG. 3 is an explosive view of the GPU tray in FIG. 1.
Figure 4:
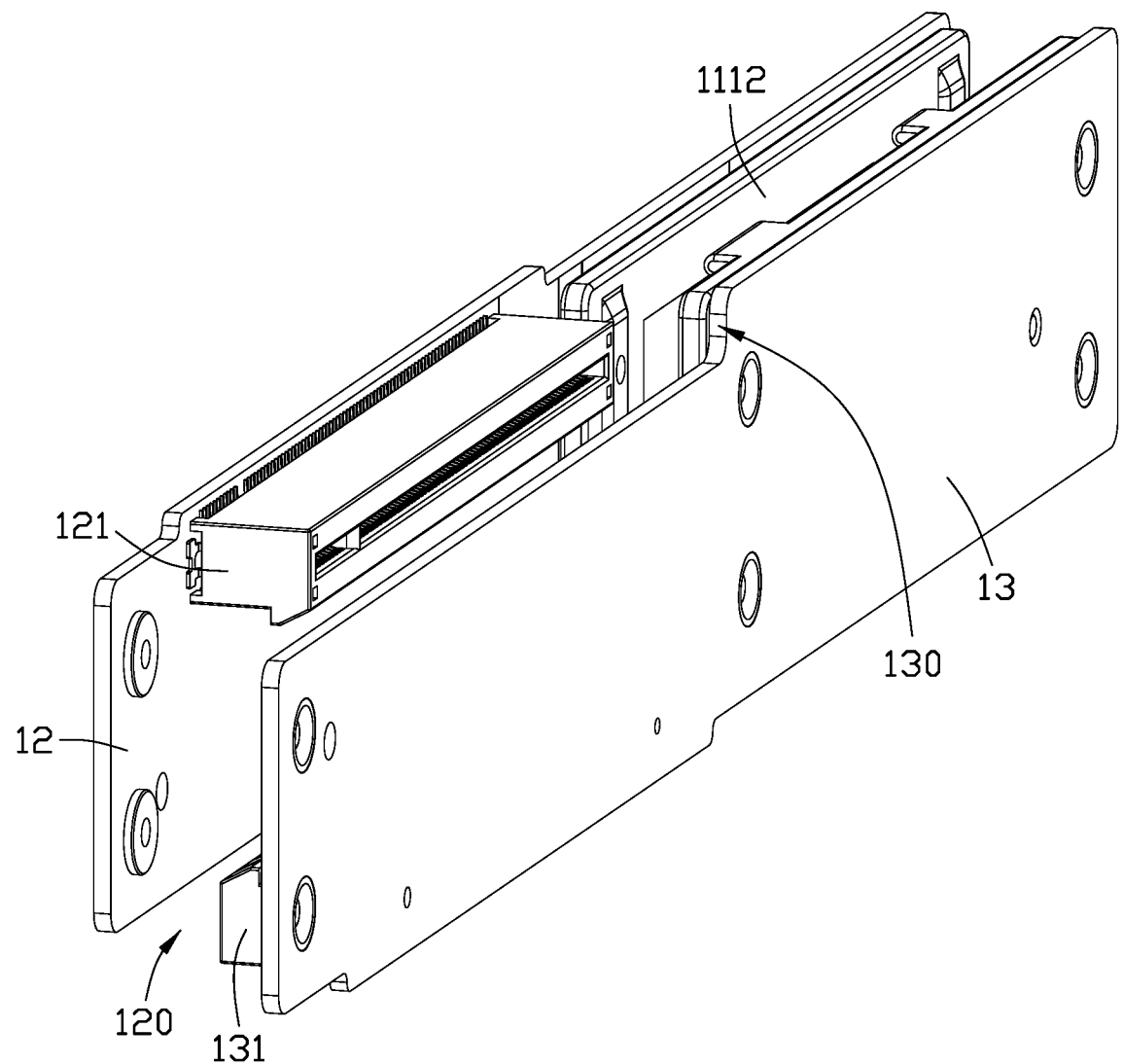
FIG. 4 is a perspective view of part of the GPU tray in FIG. 1.
Figure 5:
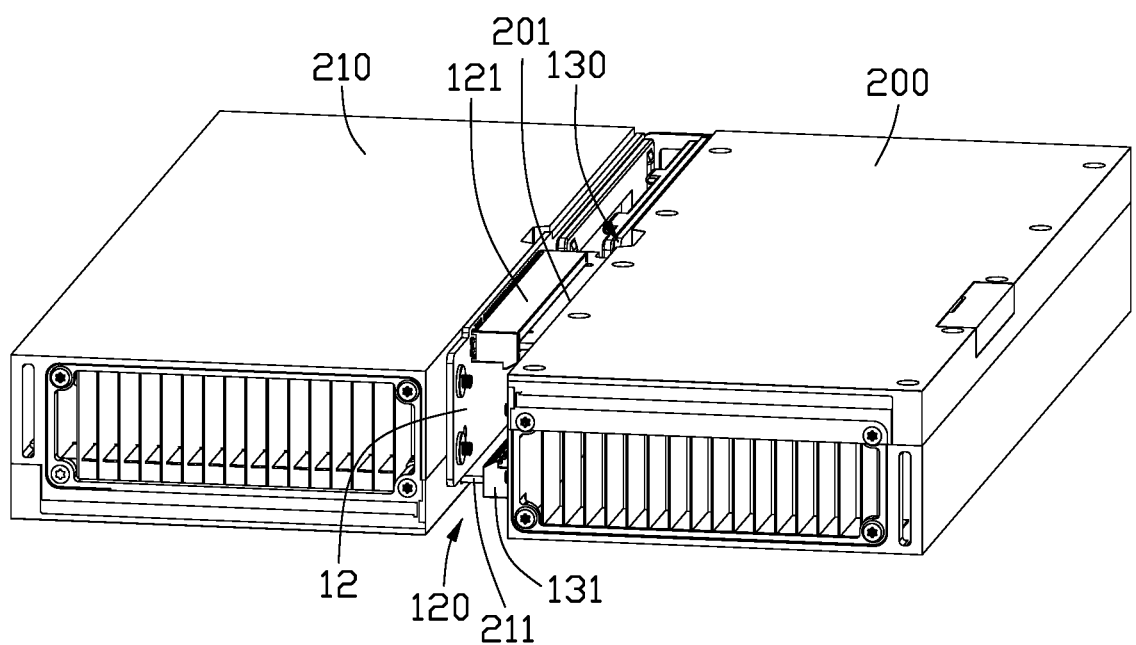
FIG. 5 is a perspective view of the GPUs mounted on the part of the GPU tray in FIG. 4.

Referring to FIG. 3, according to some embodiments, a first positioning hole 122 is defined in the end of the first riser 12 connected to the first bracket 1111, and a positioning portion 1113 is arranged on the first bracket 1111 for cooperating with the first positioning hole 122 to positioning the first riser 12 relative to the first bracket 1111. Similarly, a further first positioning hole 122 is defined in the end of the first riser 12 connected to the second bracket 1112, and a further positioning portion 1113 is arranged on the second bracket 1112 for cooperating with the further first positioning hole 122 to positioning the first riser 12 relative to the second bracket 1112. The second riser 13 is provided with two second positioning holes 132 at two ends respectively, and each of the first bracket 1111 and the second bracket 1112 is provided with a further positioning portion 1113, these two positioning portions 1113 of the first bracket 1111 and the second bracket 1112 cooperate with the two second positioning holes 132 to position the second riser 13 relative to the first bracket 1111 and the second bracket 1112. Further, the first riser 12 and the second riser 13 may be secured to the first bracket 1111 and the second bracket 1112 by bolts or by riveting.

Therefore, the positioning portions 1113, the first positioning holes 122, and the second positioning holes 132 cooperate to position the first riser 12 and the second riser 13 rapidly, and the first riser 12 and the second riser 13 can be secured to the first bracket 1111 and the second bracket 1112 accurately.

Figure 8:
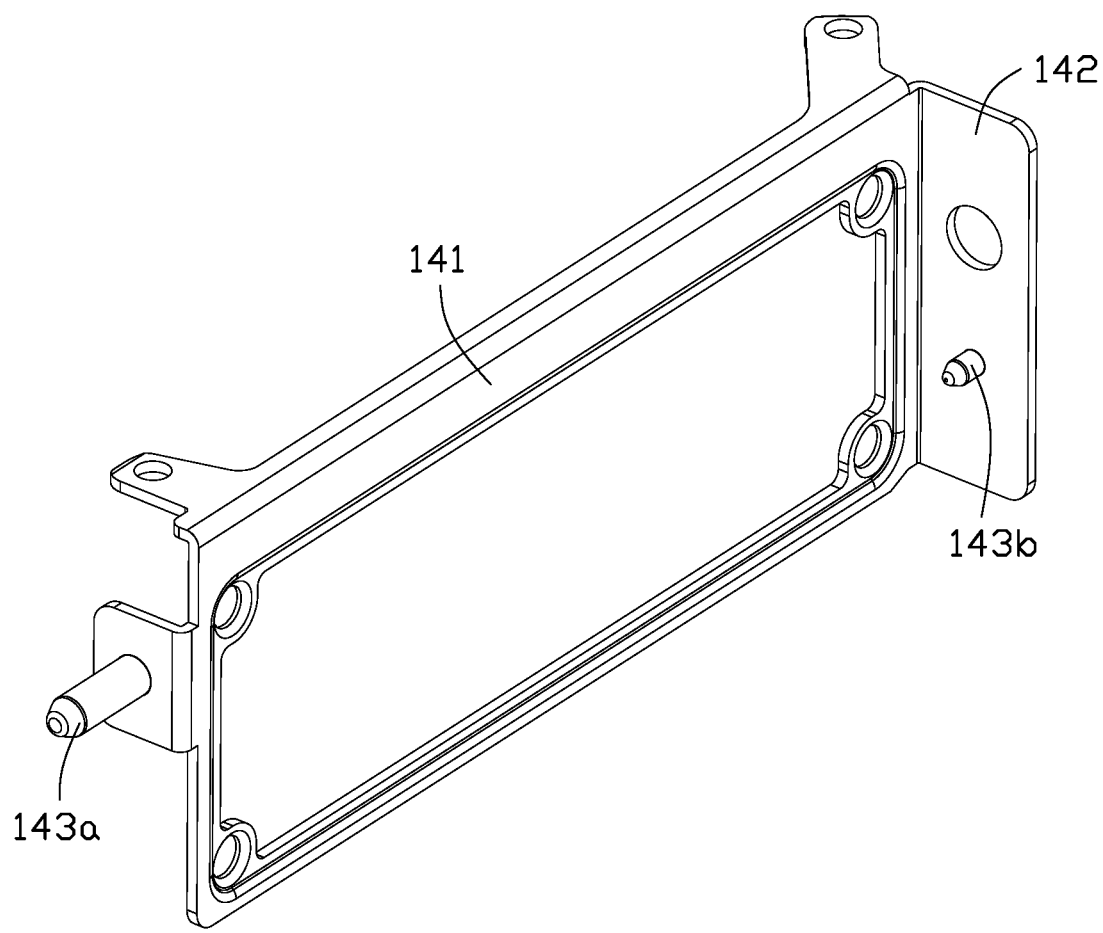
FIG. 8 is a perspective view of a mounting bracket.

Referring to FIG. 2, FIG. 3, and FIG. 8, according to some embodiments, the GPU tray includes two mounting brackets 14 mounted on the first GPU and the second GPU respectively. The installation of the first GPU 200 is provided as an example for illustration. In this embodiment, the mounting bracket 14 is L-shaped, and the mounting bracket 14 includes a first mounting plate 141 as a long arm of the L shape and a second mounting plate 142 as a short arm of the L shape. The first mounting plate 141 is mounted to the first GPU 200 by bolts, a first positioning pin 143a is provided on an end of the first mounting plate 141 away from the second mounting plate 142, and a second positioning pin 143*b* is provided on the second mounting plate 142. The base 11, in the installation area 113 for the first GPU 200, is arranged with a first through hole 114*a* corresponding to the first positioning pin 143*a* and a second through hole 114*b* corresponding to the second positioning pin 143*b*. When the first GPU is mounted to the base 11, the first positioning pin 143*a* and the second positioning pin 143*b* are inserted into the first through hole 114*a* and the second through hole 114*b* respectively, then the second mounting plate 142 is secured to the base 11 by bolts, such that the first GPU is installed in the base 11.

Similarly, the second GPU 210 is connected to the other mounting bracket 14, the base 11, in the installation area 113 for the second GPU 210, is arranged with another first through hole 114*a* corresponding to the first positioning pin 143*a* of the other mounting bracket 14 and another second through hole 114*b* corresponding to the second positioning pin 143*b* of the other mounting bracket 14. When the second GPU 210 is mounted to the base 11, the first positioning pin 143*a* and the second positioning pin 143*b* are inserted into the first through hole 114*a* and the second through hole 114*b* respectively, then the second mounting plate 142 is secured to the base 11 by bolts, such that the second GPU 210 is installed in the base 11.

Referring to FIG. 2, the GPU tray 10 further includes a connecting bracket 15, the connecting bracket 15 is arranged on the base 11 at an end away from the mounting bracket 14. In this embodiment, the connecting bracket 15 is L-shaped, and the connecting bracket 15 includes a first connecting plate 151 as a long arm of the L shape and a second connecting plate 152 as a short arm of the L shape. The second connecting plate 152 is connected to the first GPU 200 and the second GPU 210.

Therefore, the first GPU 200 and the second GPU 210 are connected to the base 11 by the mounting bracket 14, and the first GPU 200, the second GPU 210, and the base 11 form a whole. Then the connecting bracket 15 strengthen the connection between the first GPU 200, the second GPU 210, and the base 11.

Referring to FIG. 3, according to some embodiments, the second bracket 1112 is provided with one or more avoidance holes 1114 for communicating the first riser 12 with the second riser 13. The first riser 12 may be connected to the second riser 13 via wires or cables, the wires or cables extend through the one or more avoidance holes 1114.

The first bracket 1111 and the second bracket 1112 are formed by casting. Such process guarantees a structural strength of the first bracket 1111 and the second bracket 1112, especially the second bracket 1112, as machining the one or more avoidance holes 1114 in the second bracket 1112 may affect the structural strength of the second bracket 1112.

In operation, the first riser 12 and the second riser 13 are mounted on the first bracket 1111 and the second bracket 1112 by bolts, then the first GPU 200 and the second GPU 210 are plugged to the first riser 12 and the second riser 13 respectively, with the first positioning pin 143*a* and the second positioning pin 143*b* on each mounting bracket 14 are inserted into the first through hole 114*a* and the second through holes 114*b* in each installation area 113. The mounting brackets 14 are mounted to the base by bolts.

The GPU tray 10 of the embodiment allows the first connector plug 201 of the first GPU 200 to partially overlap with the second connector plug 211 of the second GPU 210, such that the GPU tray has a smaller size. The mounting bracket 14 positions the first GPU 200 and the second GPU 210 to install the first GPU 200 and the second GPU 210 accurately.

Figure 9:
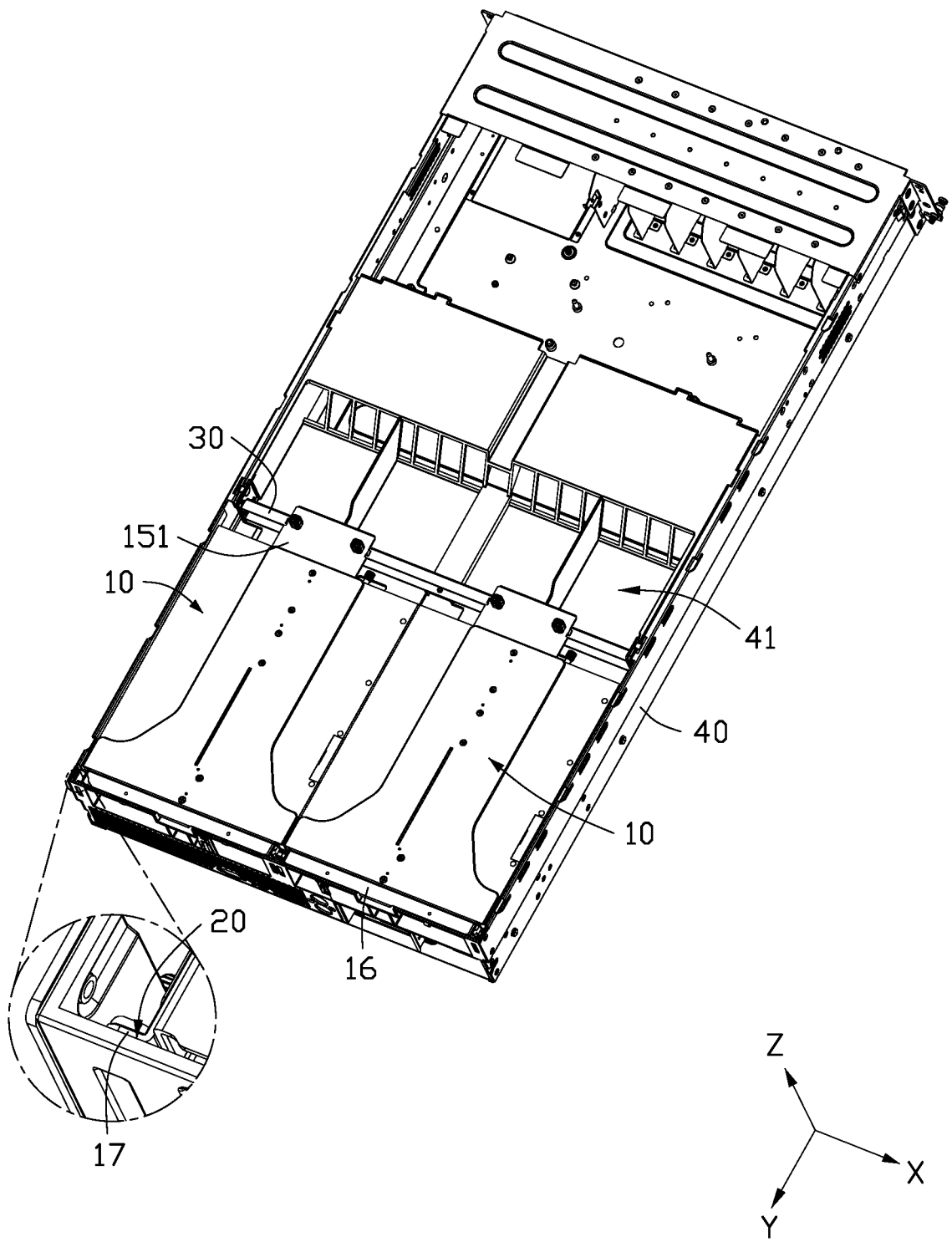
FIG. 9 is a perspective view of a chassis according to another embodiment of the present disclosure.

Referring to FIG. 3, FIG. 6, and FIG. 9, a chassis 100 is provided. The chassis 100 includes the GPU tray 10 abovementioned and a case 40. The case 40 defines a receiving groove 41 for accommodating the GPU tray 10. In this embodiment, two GPU trays 10 are arranged in the receiving groove 41, and the two GPU trays 10 are arranged in the receiving groove 41 along a widthwise direction of the chassis 100. The widthwise direction of the chassis 100 is shown as X-axis direction in FIG. 9.

The bases 11 are mounted to the case 40. In this embodiment, each base 11 is provided with two mounting members 17, and the case 40 is arranged with four mounting grooves 20, the four mounting grooves 20 are arranged along the X-axis direction, then the two bases 11 are mounted to the case 40 by inserting the mounting members 17 into the mounting grooves 20 respectively. In further embodiments, the number of the mounting members 17 on each base 11 and the mounting grooves 20 can be varied, as long as the total number of the mounting members 17 is equal to that of the mounting grooves 20.

According to some embodiments, the second through hole 114*b* is defined in the mounting member 17, for cooperating with the second positioning pin 143*b* when the first GPU 200/second GPU 210 is mounted to the base 11. In operation, when the first GPU 200/second GPU 210 is mounted to the base 11, the first positioning pin 143*a* and the second positioning pin 143*b* are inserted into the first through hole 114*a* and the second through hole 114*b* respectively, then the second mounting plate 142 is secured to the base 11 by bolts. After that, the base 11 together with the first GPU 200 and/or the second GPU 210 is mounted to the case 40, the mounting members 17 are inserted into the mounting grooves 20, such that the base 11 is accurately positioned in the case 40.

According to further embodiments, the base 11 is provided with a support bracket 16 between the two mounting members 17. When the GPU tray is mounted in the case 40, the support bracket 16 is connected to the case 40 by bolts. The case 40 is provided with a connecting beam 30 extending along X-axis direction, and the connecting beam 30 traverses opposite sides of the case 40. The first connecting plate 151 of the connecting bracket 15 is mounted to the connecting beam 30 by bolts. Therefore, the base 11 is mounted to the case 40 by the connecting bracket 15 and the support bracket 16, which provides a stable connection between the base and the case 40. The base 11 will not be loose when the case 40 is impacted.

When the base 11 is mounted to the case 40, a user needs to align the mounting members 17 with mounting grooves 20 of the case 40, then the user may use bolts to connect the connecting bracket 15 to the connecting beam 30, and connect the support bracket 16 to the case 40.

The first GPU 200 and the second GPU 210 on the base 11 are partially overlapped, such that the first GPU 200 and the second GPU 210 are close to each other and occupy smaller space in the case 40. The arrangement of the base makes full use of the space of the case 40, improves space utilization in the width direction of the case 40, and allows four GPUs to be installed in the case 40.

While the disclosure has been described in detail in connection with only a limited number of embodiments, it should be readily understood for the skilled in the art that the disclosure is not limited to such disclosed embodiments. Rather, the disclosure can be modified to incorporate any number of variations, alterations, substitutions, or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description, but is only limited by the scope of the appended claims.

What is claimed is:

1. A graphics processing unit (GPU) tray comprising:
a base provided with a first bracket and a second bracket, the first bracket and the second bracket are spaced from each other; the first bracket comprises a first mounting surface and a second mounting surface opposite to the first mounting surface, the first mounting surface and the second mounting surface are perpendicular to the base; the second bracket has a third mounting surface and a fourth mounting surface opposite to the third mounting surface, the third mounting surface and the fourth mounting surface are perpendicular to the base; the first mounting surface is located in the same plane with the third mounting surface, and the second mounting surface is located in the same plane with the fourth mounting surface;
a first riser and a second riser, the first riser is connected to one side of the first bracket and the second bracket, and two ends of the first riser are respectively connected to the second mounting surface and the fourth mounting surface; the second riser is connected to the other side of the first bracket and the second bracket, and two ends of the second riser are respectively connected to the second mounting surface and the fourth mounting surface, and the first riser is arranged opposite to the second riser relative to the first bracket and the second bracket; wherein
the first riser is provided with a first connector socket facing the second riser, and the second riser is provided with a second connector socket facing the first riser, the first connector socket is located near a side of the first riser away from the base, and the second connector socket is located near a side of the second riser, the first riser is provided with a first notch communicating with the second connector socket, and the second riser is provided with a second notch communicating with the first connector socket, a projection of the first connector socket in a direction perpendicular to the base overlaps that of the second connector socket;
the first connector socket is configured for plugging a first GPU, and the second connector socket is configured for plugging a second GPU.

2. The GPU tray of claim 1, wherein
at least one of the first bracket and the second bracket is provided with a recess, the recess is configured for accommodating a connecting member, the connecting member provides connections between the first riser, the second riser, and external components.

3. The GPU tray of claim 1, wherein
a first positioning hole is defined in each end of the first riser, each of the first bracket and the second bracket is provided with a positioning portion facing the first riser, when the first riser is connected to the first bracket and the second bracket, each positioning portion facing the first riser is inserted into one first positioning hole to position the first riser;
a second positioning hole is defined in each end of the second riser, each of the first bracket and the second bracket is provided with another positioning portion facing the second riser, when the second riser is connected to the first bracket and the second bracket, each positioning portion facing the second riser is inserted into one second positioning hole to position the second riser.

4. The GPU tray of claim 1, further comprising:
two mounting brackets spaced from each other, each mounting bracket is configured for installation of one GPU;
each mounting bracket is provided with one or more positioning pins, and the base is arranged with multiple through holes;
when the mounting brackets are mounted to the base, each positioning pin is inserted in one of the multiple through holes for positioning the mounting brackets relative to the base.

5. The GPU tray of claim 4, further comprising:
a connecting bracket arranged on the base at an end away from the mounting bracket, the connecting bracket is connected to the first GPU at one end and connected to the second GPU at the other end.

6. The GPU tray of claim 1, wherein
the second bracket is provided with one or more avoidance holes for communicating the first riser with the second riser.

7. A chassis comprising:
a case defining a receiving groove;
two GPU trays, each of the two GPU trays according to the GPU tray of claim 1 received in the receiving groove, the two GPU trays are arranged side by side along a widthwise direction of the case, and the two GPU trays are arranged for supporting the first GPU and the second GPU, such that the first GPU and the second GPU are installed in the case.

8. The chassis of claim 7, wherein
each end of the base along a width direction of the base is provided with a mounting member, and the case is arranged with four mounting grooves arranged along the widthwise direction of the case, each mounting groove is corresponding to one of the mounting members of the bases of the two GPU trays, the mounting member is slidably inserted in the corresponding mounting groove to position the base.

9. The chassis of claim 8, wherein
the base is provided with a support bracket between the mounting members, the support bracket is secured to the case by bolts to connect the GPU tray to the case.

10. The chassis of claim 7, wherein
the case is provided with a connecting beam, the connecting bracket is mounted to the connecting beam to connect the GPU tray to the case.

* * * * *